United States Patent [19]
Shamouilian et al.

[11] Patent Number: 5,592,358
[45] Date of Patent: Jan. 7, 1997

[54] ELECTROSTATIC CHUCK FOR MAGNETIC FLUX PROCESSING

[75] Inventors: Shamouil Shamouilian, San Jose; John F. Cameron, Los Altos; Chandra Deshpandey, Fremont; Yuh-Jia Su, Cupertino, all of Calif.

[73] Assignee: Applied Materials, Inc., Santa Clara, Calif.

[21] Appl. No.: 276,841

[22] Filed: Jul. 18, 1994

[51] Int. Cl.$^6$ .................................................. H02N 13/00
[52] U.S. Cl. ........................................................ 361/234
[58] Field of Search ............................... 361/234; 269/8; 279/128

[56] References Cited

U.S. PATENT DOCUMENTS

| | | |
|---|---|---|
| 4,184,188 | 1/1980 | Briglia . |
| 4,384,918 | 5/1983 | Abe . |
| 4,399,016 | 8/1983 | Tsukada et al. . |
| 4,431,473 | 2/1984 | Okano et al. ............................ 156/345 |
| 4,771,730 | 9/1988 | Tezuka . |
| 5,155,652 | 10/1992 | Logan et al. ............................ 361/234 |
| 5,184,398 | 2/1993 | Moslehi .................................... 29/825 |
| 5,310,453 | 5/1994 | Fukusawa et al. ....................... 156/643 |
| 5,484,485 | 1/1996 | Chapman ............................ 118/723 R |

FOREIGN PATENT DOCUMENTS

| | | |
|---|---|---|
| 62-072121 | 4/1987 | Japan . |
| 63-223173 | 9/1988 | Japan . |
| 1-298721 | 12/1989 | Japan . |
| 2-27748 | 1/1990 | Japan . |
| 03179735 | 8/1991 | Japan . |

OTHER PUBLICATIONS

European Search Report, Application EP 95 11 1280.4, dated Nov. 3, 1995.
Klein, Allen J., "Curing Techniques for Composites," *Advanced Composites*, Mar./Apr. 1988, pp. 32–44.
"Data Sheet . . . Breathers and Bleeders," Data Sheet from Airtech International, Inc., Carson, California (1993).
"Kapton General Information," Technical Brochure from DuPont de Nemours Company, Wilmington, Delaware (1993).
"R/flex® 1100 High Temperature Materials," Data Sheet DS20903D, Rogers Corporation, Chandler, Arizona (1993).
U.S. Patent application entitled, "An Electrostatic Chuck Having a Grooved Surface," by Roger J. Steger, filed Jul. 20, 1993 (Applied Materials Docket 260).
U.S. Patent application entitled, "Electrostatic Chuck with Erosion–Resistant Electrode Connection".
U.S. Patent application entitled, "Erosion Resistant Electrostatic Chuck".

*Primary Examiner*—Fritz Fleming
*Attorney, Agent, or Firm*—Ashok K. Janah; Peter J. Sgarbossa

[57] ABSTRACT

An electrostatic chuck 20 for holding substrates 42 in a process chamber 40 containing a magnetic flux 43 comprises a base 22 having an upper surface adapted to support a substrate 42 thereon. An insulator 26 with an electrode 24 therein, is on the base 22. A magnetic shunt 34 comprising a ferromagnetic material is positioned (i) either on the base 22, or (ii) in the insulator 26, or (iii) directly below, and contiguous to, the base 22.

28 Claims, 3 Drawing Sheets

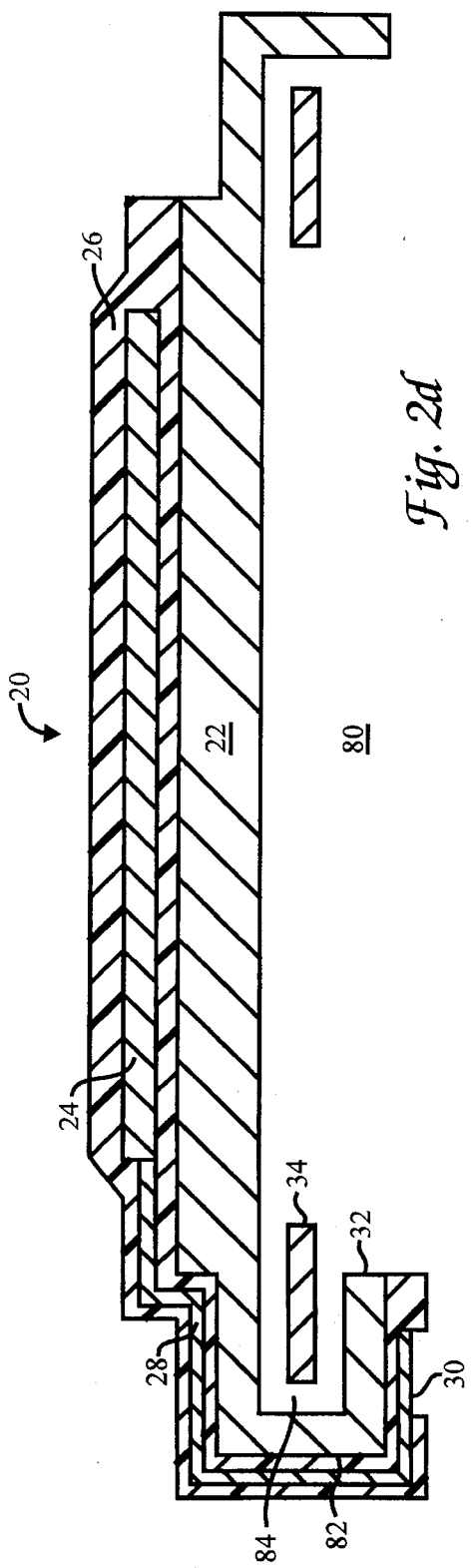
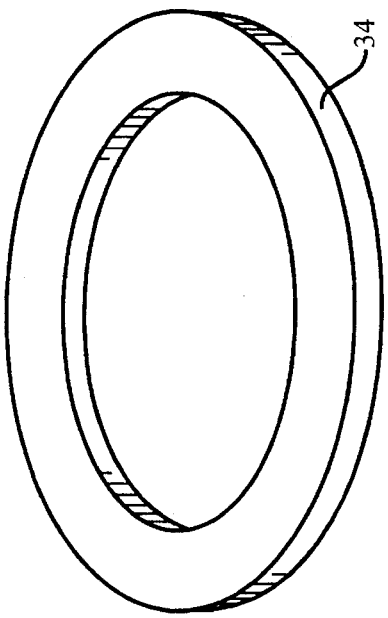

ELECTROSTATIC CHUCK FOR MAGNETIC FLUX PROCESSING

BACKGROUND

This invention relates to an electrostatic chuck for holding a substrate in a process chamber containing a magnetic flux.

In semiconductor fabrication processes, electrostatic chucks are used to hold substrates, such as silicon wafers, during processing of the substrate. Electrostatic chucks are generally described in, for example, U.S. Pat. No. 4,184,188, to Briglia; U.S. Pat. No. 4,399,016, to Tokuda; U.S. Pat. No. 4,384,918, to Abe; and U.S. patent application Ser. No. 08/189,562, entitled "Electrostatic Chuck" by Shamouilian, et al., filed on Jan. 31, 1994—all of which are incorporated herein by reference.

A typical electrostatic chuck comprises a base adapted to be secured to a support in a process chamber. An electrically insulated electrode is on the base, and underside of the base typically comprises a cavity. An electrical connector electrically connects the insulated electrode on the base to an electrical contact on the bottom of the base. The electrical contact is supported by a support member which extends into the cavity of the base.

During its use, the chuck is secured to a support in a process chamber, so that the electrical contact on the bottom of the base electrically contacts a voltage supply connector on the support. A substrate is placed on the upper surface of the chuck, and the electrode in the chuck is electrically biased with respect to the substrate by a voltage applied via the electrical contact of the chuck. The applied voltage causes electrostatic charge to accumulate in the insulated electrode of the chuck and in the substrate, and the resultant electrostatic force holds the substrate to the chuck.

Electrostatic chucks are used in semiconductor fabrication processes, such as deposition processes and etching processes. In a typical etching process, etchant process gas is introduced in the process chamber, and a plasma is formed from the process gas for etching the substrate. During the etching process, a magnetic flux can be generated in the process chamber to enhance the uniformity and rate of etching of the substrate. Typically, the magnetic flux has a component which is parallel to the surface of the substrate. The magnetic field confines electrons and reactive species near the surface of the substrate thereby increasing ionizing collisions. In such etching processes, the peripheral portions of the substrate are typically etched faster than the central portions of the substrate, because etchant gas ingress, and gaseous byproduct removal, are faster at the peripheral substrate regions.

In such etching processes an annular magnetic shunt, positioned in the cavity on the underside of the base can be used to control the rate of etching of the peripheral portions of the substrate which are adjacent to the annular magnetic shunt. The magnetic shunt typically comprises a ferromagnetic material which attracts the magnetic flux, thereby causing the magnetic flux above the shunt to be redirected toward the shunt, instead of parallel to the substrate surface. The resultant depletion of magnetic flux above the peripheral portions of the substrate reduces the rate of etching of the substrate at these regions. In this manner, magnetic shunts are used to control etch rates across the substrate surface, to obtain more uniform etching of the substrate. More uniform substrate etching provides higher IC chip yields and allows utilization of the entire substrate surface.

However, there are several problems with conventional magnetic shunt configurations. One problem is that conventional magnetic shunts do not uniformly deplete the magnetic flux above the substrate. It is believed that the non-uniform depletion results from discontinuities and cutaways in the conventional shunts. Conventional shunts are typically positioned in the cavity of the base, and are configured to circumvent projections, such as supports, projections, water cooling tubes, and screw holders in the base. The discontinuities in the magnetic shunt result in non-uniform etch rates across the periphery of the substrate.

Another problem with conventional magnetic shunts is that the shunts result in non-uniform heat transfer rate between the substrate and the support, because the heat transfer rates differ between the continuous and discontinuous portions of the shunt. Non-uniform heat transfer rates result in non-uniform temperatures across the surface of the substrate, resulting in non-uniform etch rates.

Thus, it is desirable to have electrostatic chuck and magnetic shunt configuration that allows uniform magnetic shunting across the surface of the wafer, and allows uniform heat transfer between the substrate and the support. It is also desirable for the magnetic shunt to be disposed proximate to the substrate to enhance magnetic shunting through the substrate.

SUMMARY

An electrostatic chuck of the present invention satisfies these needs. The electrostatic chuck comprises a base having an upper surface adapted to support a substrate thereon. An insulator with an electrode therein, is on the base. A magnetic shunt comprising a ferromagnetic material is disposed above the base, or disposed directly below and contiguous to the base. When the chuck is used to electrostatically hold a substrate in the process chamber containing a magnetic flux, the magnetic shunt in the chuck causes the magnetic flux in the chamber to be depleted above those portions of the substrate which are proximate to the magnetic shunt. This results in more uniform processing of the substrate held by the chuck.

Several configurations of the magnetic shunt are possible. In one configuration, the magnetic shunt is positioned between the base and the insulator, and in direct contact with the base. In another configuration, the magnetic shunt is in the insulator. In a third version of the invention, the electrode in the insulator comprises a ferromagnetic material which operates as a magnetic shunt.

In another configuration, a substrate support adapted for supporting a substrate is on the base of the chuck. The substrate support includes a cavity therein, and an insulated electrode is on the substrate support. A ferromagnetic magnetic shunt is within the cavity of the substrate support.

In another version of the invention, a continuous magnetic shunt is disposed directly below, and contiguous to the base.

The magnetic shunts are preferably continuously annular. Preferably, the magnetic shunts are made of a ferromagnetic material such as iron, nickel, cobalt, and alloys thereof.

DRAWINGS

These and other features, aspects, and advantages of the present invention will become better understood with reference to the following description, appended claims, and accompanying drawings, where:

FIG. 2d is a cross-sectional, side elevational view of another version of the chuck of the present invention, showing a continuous magnetic shunt positioned in the cavity of the base of the chuck;

FIG. 3 is a perspective view of a continuous magnetic shunt of the present invention.

DESCRIPTION

Figure 1:
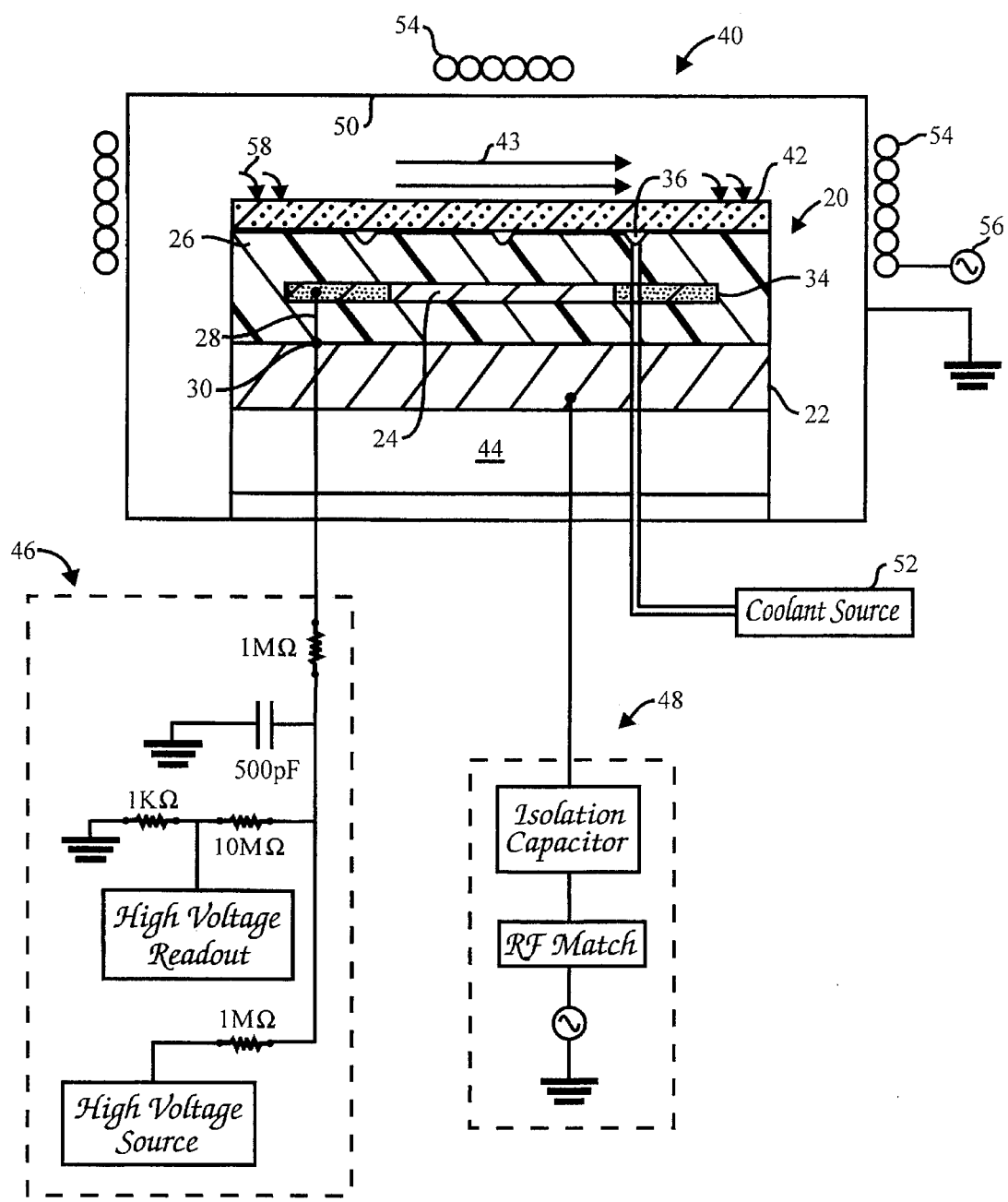
FIG. 1 is a cross-sectional, side elevational schematic view of a processing chamber containing an electrostatic chuck of the present invention.

An electrostatic chuck 20 of the present invention generally comprises a base 22 with an electrically insulated electrode 24 on the base. The electrode is electrically isolated by an insulator 26. An electrical connector strap 28 electrically connects the electrode 24 on the chuck to a high voltage electrical connector 30 on the base of the chuck 20. The high voltage electrical connector 30 is supported by a support member 32. A magnetic shunt 34 is placed above, or directly below, and contiguous to, the base 22 of the chuck. The chuck 20 can also have grooves 36 therein, the grooves 36 being provided for holding a coolant gas therein, for cooling a substrate held by the chuck.

With reference to FIG. 1, operation of the chuck 20 of the present invention will now be described. FIG. 1 shows a typical process chamber 40 containing a magnetic flux, which can be used to process a substrate 42, such as a silicon wafer. Typically, the magnetic flux has a component in a plane parallel to the direction of the arrows 43. The particular embodiment of the process chamber 40 shown herein is suitable for plasma processing of substrates 42, and is provided only to illustrate operation of the chuck 20, and should not be used to limit the scope of the invention.

The process chamber 40 generally comprises a support 44 with the electrostatic chuck 20 on the support 44. An external first voltage supply 46 is connected to the electrode 24 in the chuck and provides a voltage for operating the chuck 20. The first voltage supply 46 comprises a high voltage DC source of about 1000 to 3000 volts, connected to a high voltage readout, through a 10MΩ resistor. The 1MΩ resistor in the circuit limits the current flowing though the circuit, and a 500 pF capacitor is provided as an alternating current filter.

An external second voltage supply 48 is connected to the support 44 in the chamber. The support 44 in the process chamber 40 is typically made from aluminum and functions as a process electrode for forming a plasma in the chamber. The second voltage supply 48 is provided for electrically biasing the support 44 with respect to an electrically grounded surface 50 in the chamber 42 for forming the plasma in the chamber 40. The voltage supply 48 is conventional and generally comprises an RF impedance that matches impedance of the process chamber 40 to the impedance of the line voltage, in series with an isolation capacitor, as shown in FIG. 1.

A coolant source 52 can be used to remove heat from the substrate 42, to maintain the substrate 42 at a constant temperature.

The process chamber 40 also has cylindrical coils 54 wrapped around the chamber 42, that serves as a magnetic flux generator. The coils 54 are connected to an alternating current source 56. When an alternating current is applied through the coils 54, the coils 54 establish a magnetic field having a component with magnetic flux lines 43 substantially parallel to the surface of the substrate 42 in the chamber 40. During processing of the substrate 42, the alternating current through the coils 54 is varied so that the magnetic flux lines rotate in a plane parallel to the surface of the substrate to produce a more uniform time-averaged magnetic field in the process chamber 40. The time-averaged magnetic field provides a more uniform plasma density thereby allowing more uniform etch rates across the surface of the substrate 42.

During its use, the chuck 20 is placed on the support 44. A substrate 42 is placed on the chuck 20, and the electrode 24 is electrically biased with respect to the substrate by a voltage applied by the first voltage supply 44, so that electrostatic charge accumulates in the substrate 42 and in the electrode 24, causing the substrate to be electrostatically held to the chuck 20. The magnetic shunt 34 attracts the magnetic flux above the shunt, as diagrammatically shown by the arrows 58, causing depletion of the magnetic flux above those portions of the substrate 42 that are proximate to the shunt 34. Typically, the magnetic shunt 34 comprises ferromagnetic material distributed in a configuration which concentrates ferromagnetic material toward the periphery of the insulator 26.

Particular aspects of the chuck 20 will now be discussed in detail.

The base 22 of the chuck is provided for supporting the insulated electrode 24. Generally, the base 22 has a shape and size corresponding to the shape and size of the substrate 42 to maximize the heat transfer surface between the base and the substrate 42, and to provide a wide surface for holding the substrate 42. For example, if the substrate 42 is disk shaped, a cylindrically shaped base having an upper surface sized for supporting a substrate. Alternatively, the base 22 can have a shape different from the shape of the substrate 42 or a size different from the size of the substrate 42. Typically, the base is made from a non-ferromagnetic material, such as aluminum. Typically, the base is a right cylinder having a diameter of about 100 mm to 225 mm (4 to 9 inches), and a thickness of about 1.5 to 2 cm.

The size and shape of the insulated electrode 24 on the base also varies according to the size and shape of the substrate 42. For example, as shown in the drawings, if the substrate 42 is disc-shaped, the insulated electrode 24 is also disc-shaped to maximize the area of the electrode in contact with the substrate 42. The top surface of the insulator 26 of the electrode 24, is adapted to support a substrate 42 thereon. The electrode 24 is made from an electrically conductive material, such as metal, for example, copper, nickel, chromium, aluminum, iron, and alloys thereof. Typically, the thickness of the electrode 24 is from about 1 μm to 100 μm, and more typically from about 1 μm to 30 μm.

The electrode 24 be continuous as shown in FIG. 1, or can be patterned as shown in FIG. 2. Preferably, the electrode 24, is patterned into one of several alternative configurations. In one patterned configuration, the electrode 24 forms interconnected features, the features sized so that the grooves 36 can be formed between the electrode features, the grooves 36 provided for holding a coolant therein for cooling the substrate 42.

In another configuration, the patterned electrode 24 comprises at least one pair of electrodes, so that the electrode 24 can function as a bipolar electrode. Suitable bipolar electrode configurations are disclosed in U.S. Pat. Nos. 4,184,188 to Briglia; 4,384,918 to Abe; and Tsukada et al.,—all of which are incorporated herein by reference. When a bipolar electrode 24 configuration is used, voltages are applied to each of the pair of electrodes, to maintain the pair of electrodes at opposite polarities. The bipolar electrode configurations allows accumulation of electrostatic charge in the substrate 42, without electrically biasing the substrate. Bipolar electrode configurations can be advantageous when the chuck 20 is used for non-plasma processes, where there are no charged plasmas species that serve as change carriers for electrically biasing the substrate 42.

The electrode 24 is electrically isolated from the chuck 20 by the insulator 26. The insulator 26 typically comprises a synthetic polymer such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber.

The overall thickness of the insulator 26 varies according to the electrical resistivity and dielectric constant of the insulative material used to form the insulator 26. Typically, the insulative material has a resistivity ranging from about $10^{13}$ Ω cm to $10^{20}$ Ω cm, and a dielectric constant of at least about 2, and more preferably at least about 3. When the insulative material has a dielectric constant of about 3.5, the entire insulator 26 is typically about 10 μm to about 500 μm thick, and more typically from about 100 μm to about 300 μm thick.

When a polyimide is used as the insulator 26, the insulator has a dielectric breakdown strength of at least about 100 volts/mil (3.9 volts/micron), and more typically at least about 1000 volts/mil (39 volts/micron).

Preferably, the top of insulator 26 is resistant to temperatures in excess of 50° C., and more preferably resistant to temperatures in excess of 100° C., so that the chuck 20 can be used in processes where the substrate 42 is heated. Also, preferably, the insulative material has a high thermal conductivity so that heat generated in the substrate 42 during processing can dissipate through the chuck 20. The thermal conductivity of the insulator 26 should be at least about 0.10 Watts/m/° K., to allow sufficient heat transfer to preclude overheating of the substrate 42.

The insulative material can also include high a thermal conductivity filler material, such as diamond, alumina, zirconium boride, boron nitride, and aluminum nitride for increasing the thermal conductivity and resistance to plasma corrosion. Preferably the filler material is a powder with an average particle size of less than about 10 μm. Typically, the filler is dispersed in the insulative material in a volumetric ratio from about 10% to 80%, and more typically from about 20% to 50%.

Preferably, the top of the insulator 26 has spaced apart grooves 36 therein, the grooves 36 sized and distributed to hold coolant from a coolant source 52 for cooling the substrate 42. The grooves 36 can form as a pattern of intersecting trenches, the trenches lying between the features of the electrodes 24. Alternative groove patterns are described in for example, "Electrostatic Chuck" by Shamouilian, et al., as referenced above.

Additionally, a protective coating (not shown) can be applied on top of the insulator 26 to protect the insulator 26 from chemical degradation when the chuck 20 is used in corrosive processing environments. Preferred protective coatings and processes for their fabrication are described in more detail in for example U.S. patent application Ser. No. 08/052,018, filed on Feb. 22, 1993, entitled "PROTECTIVE COATING FOR DIELECTRIC MATERIAL ON WAFER SUPPORT USED IN INTEGRATED CIRCUIT PROCESSING APPARATUS AND METHOD OF FORMING THE SAME," by Wu, et al., which is incorporated herein by this reference.

The chuck 20 also comprises an electrical connector for connecting the electrode 24 to the first voltage supply 46. The electrical connector comprises an electrically conductive strap 28 which connects the insulated electrode to a high voltage electrical connector 30 on the bottom of the base 22. The high voltage electrical connector 30 rests on a support member 32 which extends into a cavity in the base 22, as shown in FIG. 2d.

Magnetic Shunt

Preferably, the magnetic shunt 34 of the chuck 20 is continuous, with no breaks or discontinuities therebetween. This is a significant improvement over the prior art. Prior art shunts which are discontinuous, result in non-uniform etching of the substrate 42, at those portions of the substrate 42 adjacent to the discontinuity in the shunt. Inherent limitations in prior art chuck configurations necessitated that prior art magnetic shunts have breaks and discontinuities therein. The magnetic shunt and chuck assembly of the present invention avoids the prior art limitations by allowing use of a continuous magnetic shunt.

It is believed that a continuous magnetic shunt 34 is advantageous because it would uniformly deplete the magnetic flux above the periphery of the substrate 42, thereby resulting in more uniform etch rates across the substrate surface. Another advantage of the continuous shunt 34 is that the shunt can allow uniform heat transfer from the substrate 42 to the support 44, resulting in uniform temperatures across the surface of the substrate 42.

The magnetic shunt 34 is typically made from a ferromagnetic material that has an high relative magnetic permeability, such as nickel, iron, cobalt, and alloys thereof. Magnetic permeability (μ) is defined as the magnetic flux density B (magnetic induction) produced in a material by a magnetic field, divided by the intensity of the magnetic field H. Relative magnetic permeability $\mu_r$ is the ratio of the permeability of the material to the permeability of air:

$$\mu_r = \mu/\mu_o$$

where the permeability of air $\mu_o$ has the value $4\pi \times 10^{-7}$ henry/m. Relative magnetic permeability is a pure number, and is independent of any system of units.

Ferromagnetic materials have a relative magnetic permeability of at least about 100, more typically at least about 500, and most typically at least about 1000. The relative magnetic permeability value depends upon the value of H and the previous magnetic history of the material. Typically, ferromagnetic materials, such as iron, nickel and cobalt, have a value of μ of at least about 1 thousand. Conventional techniques can be used to measure the magnetic permeability of materials, such as for example, Rowland Ring methods and Permeameters.

The high magnetic permeability of the magnetic shunt 34 causes the shunt to exhibit low inductance to the magnetic flux lines 43 in the process chamber 40. This causes the magnetic shunt 34 to attract the magnetic flux lines 43 above the shunt, thereby depleting the magnetic flux above the portions of the substrate 42 proximate to the magnetic shunt, as shown in FIG. 1.

The magnetic shunt 34 is configured to correspond to the shape and size of the those portions of the substrate that exhibit excessive etching rates. Excessive etching rates are determined by etching substrates using conventional etching processes, and mapping out the regions of excessive etching by examining the etched substrates in a scanning electron microscope. Thus, the shape and size of the magnetic shunt 34 depends on the etching characteristics of the particular process chamber, the process gases and process conditions used to etch the substrate, and shape and size of the substrate 42.

In the most conventional etching processes, the periphery of the substrate 42 is etched faster than the central portions of the substrate 42. Thus, the magnetic shunt is typically configured to preferentially concentrate ferromagnetic material toward the periphery of the substrate 42. Because semiconductor substrates 42 are generally circular, the magnetic shunt 34 is typically annular, with an external diameter corresponding to the diameter of the substrate 42.

A suitable annular magnetic shunt 34 is shown in FIG. 3. The shunt 34 has an internal diameter of at least about 100 mm (4 inches), and an external diameter of at least about 225 mm (8 inches). The thickness of the shunt 34 varies according to the distance between the shunt 34 and the substrate 42, and the magnetic permeability of the magnetic shunt 34. A thinner shunt can be used when the magnetic shunt 34 is positioned close to the substrate 42. A suitable thickness for a nickel containing shunt positioned about 10 mm from the substrate 42, is from about 100 microns to about 1,000 microns.

Figure 2A:
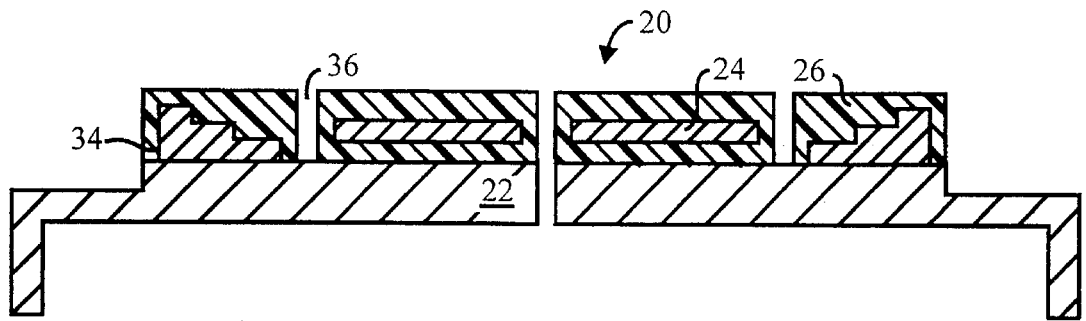
FIG. 2a is a cross-sectional, side elevational view of a chuck of the present invention, showing a magnetic shunt above the base of the chuck.

The shape of the continuous magnetic shunt can differ considerably for non-conventional etching processes. For example, other etching processes can require a shunt 34 which is segmented into thicker and thinner segment portions as shown in FIG. 2(a) to selectively enhance or reduce the magnetic shunting effect at different portions of the substrate 42.

Positioning of the Magnetic Shunt

The magnetic shunt 34 can be positioned in different portions of the chuck 20. Preferably, the shunt 34 is positioned above the base 22 of the chuck 20, and below the top surface of the insulator 26, so that the shunt is close to the substrate 42 held on the chuck. The proximity of the shunt 34 to the substrate 42 increases the shunting effect of the magnetic shunt. Also, because the base does not lie between the shunt and the substrate, a thinner shunt can provide equivalent magnetic shunting. Furthermore, thinner magnetic shunts also promote more uniform, and faster, heat transfer between the substrate 42 and the support 44, thereby allowing faster and more uniform control of the temperature of the substrate 42.

Several different chuck configurations allow the magnetic shunt to be close to the substrate 42, as shown in FIGS. 2a–2d. In the configuration shown in FIG. 2a, the shunt is positioned directly in contact with the base 22. This configuration allows the shunt 34 to be fabricated as an integral part of the base 22. For example, the shunt 34 can be fabricated by coating the upper surface of the base 22 using a ferromagnetic material, such as by electroplating, as described below in further detail. Also, because the shunt 34 is an integral part of the base 22, substantially higher heat transfer rates are obtained between the substrate 42 and the support 44.

Figure 2B:
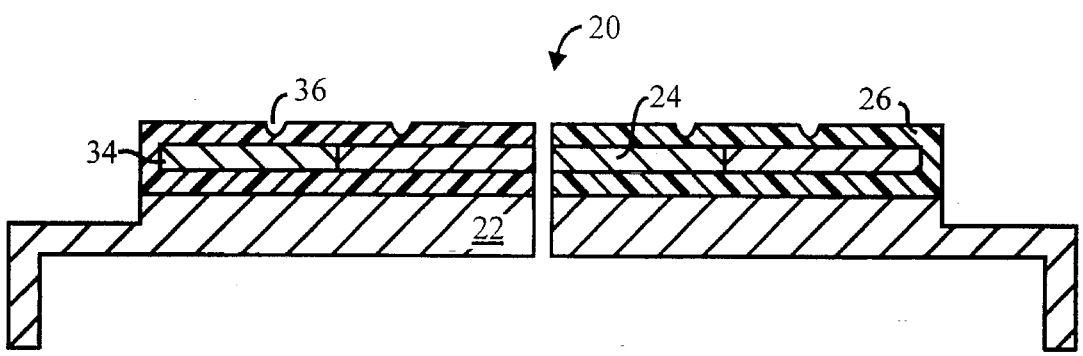
FIG. 2b is a cross-sectional, side elevational view of another version of the chuck of the present invention, showing a magnetic shunt in the insulator of the chuck.

In the configuration shown in FIG. 2b, the magnetic shunt is embedded within the insulator 26. In this configuration, the shunt 34 can be shaped as a ring surrounding a disc-shaped electrode 24. Alternatively, the shunt 34 and electrode 24 can be an unitary element. Also, the shunt 34 can be integrated with the electrode 24 as shown in FIG. 1, such as for example when the electrode 24 comprises a ferromagnetic material. In these configurations, the shunt 34 is embedded in the insulator 26 on the chuck 20. These latter configurations are advantageous because they allow fabrication of the shunt and electrode as a single element, thereby lowering fabrication and assembly costs for the chuck 20.

Figure 2C:
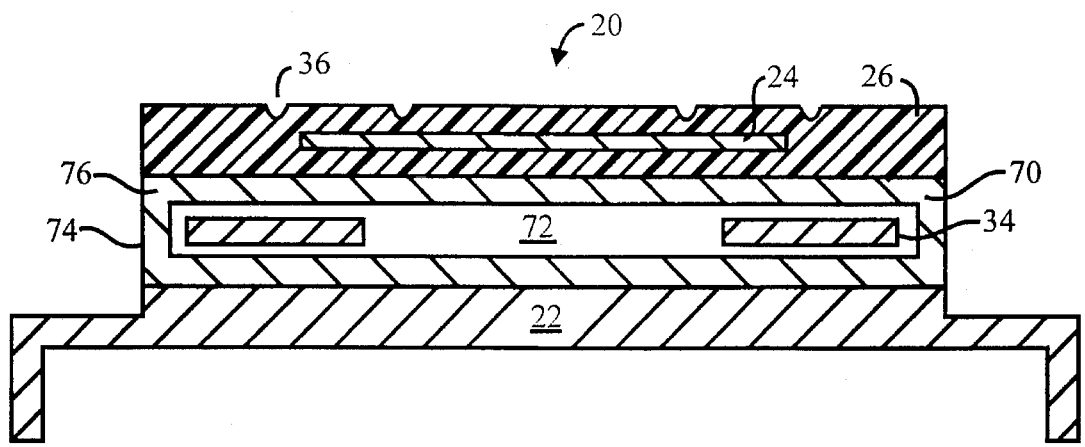
FIG. 2c is a cross-sectional, side elevational view of another version of the chuck of the present invention, showing a magnetic shunt positioned in a substrate support on the base of the chuck.

In the configuration shown in FIG. 2c, the magnetic shunt 34 is positioned in substrate support 70 on the base 22. The substrate support 70 has a top surface adapted for supporting a substrate 42, and the support 70 includes a cavity 72 therein. Typically, the substrate support 70 comprises peripheral sidewalls 74 extending upwardly from the base 22. A cover plate 76 is sized to fit over the sidewall 74 and forms the top surface of the substrate support 70. In this configuration, the magnetic shunt 34 is sized to fit within the substrate support 70. This configuration allows the shunt 34 to be adapted to provide optimal shunting for specific substrate processes.

In the configuration shown in FIG. 2d, the magnetic shunt 34 is disposed directly below, and contiguous to, the base 22. Typically the base 22 has a cavity 80 under the base. The support member 32 extends into the cavity 80, and is provided for supporting the high voltage electrical connector 30. In the chuck of the present invention, the continuous annular magnetic shunt 34 extends into the gap 82 between the support member 32 and the base 22. The cavity 80 is defined by a peripheral wall 84 extending downwardly from the base 22.

Method of Manufacture

A preferred process for making an electrostatic chuck 20 according to the present invention, is described below. The process of making the version of the chuck 20 shown in FIG. 2a, will be described, and thereafter, the processes of manufacture for making the other versions of the chuck will be described.

The version of the chuck shown in FIG. 2a, generally comprises: (a) a base 22 having an upper surface adapted to support a substrate thereon, (b) an insulator 26 with an electrode 24 embedded therein on the base 22, and (c) a magnetic shunt 34 comprising a ferromagnetic material on the base 22, at least a portion of the shunt 34 being contiguous with the insulator 26.

The base 22 of the chuck 20 is typically machined from an aluminum plate, cut into a right-cylindrical shape with a thickness of about 1.5 to 1.8 cm and a diameter of about 100 to 300 mm, to match the diameter of the substrate which typically ranges from about 127 to 203 mm (5–8 inches). The top and bottom surfaces of the aluminum plate are ground using conventional aluminum grinding techniques, until the surface roughness of the plate is less than about 1 micron. Surface grinding of the plate is essential for the base to uniformly contact the support 44, and the substrate placed on the base 22, to allow for efficient thermal transfer between the substrate 42 and the support 44. After grinding, the plate is thoroughly cleaned to remove grinding debris.

After forming the base 22, a magnetic shunt 24 comprising a ferromagnetic material, is formed above, and in direct contact with the base 22. The magnetic shunt 34 can be formed by a variety of different techniques, including electroplating, chemical vapor deposition, and physical vapor deposition techniques such as sputter coating. Suitable electroplating techniques for electroplating iron or nickel or alloys thereof, are generally described in U.S. Pat. Nos. 5, 160,423 to Yokoi; 4,960,653 to Yokoi; 4,780,342 to LeBlanc; 3,617,343 to Kandler; and 3,655,532 to Marker, all of which are incorporated herein by reference.

The insulated electrode 24 is separately fabricated and adhered over the shunt 34. The insulated electrode 24 can be fabricated by numerous techniques, such as for example, those disclosed in aforementioned U.S. patent application No. 08/189,562. A preferred method uses a multilayer film, comprising an insulative layer and an electrically conductive electrode layer, such as "R/FLEX 1100" film fabricated by Rogers Corporation, Chandler, Ariz., which comprises a layer of copper on a 25 to 125 μm thick polyamide insulator layer. The copper layer of the multi-layer film is etched, routed, or milled to form a patterned electrode shape. Any conventional etching process can be used to etch the copper layer to form an electrode 24. In the typical etching process, a uniform layer of photoresist material, such as "RISTON" fabricated by DuPont de Nemours Chemical Co., Wilmington, Del., is applied on the electrode layer. Conventional photolithographic methods, such as those described in U.S. Pat. No. 4,952,528, to Abe, et al., U.S. Pat. No. 5,079,600, to Schnur, et al., U.S. Pat. No. 5,221,422, to Das, et al. all of which are incorporated herein by this reference, are then used to form a patterned protective resist layer on the copper layer.

The electrode layer with the patterned photoresist thereon is then etched, using wet or dry chemical etching methods. A suitable wet chemical etching method comprises immersing the electrode layer of the film into an etchant such as ferric chloride, sodium persulfate, or an acid or base, until the electrode layer is etched. Suitable dry etching processes are described in U.S. Pat. Nos. 3,615,951 to Franco, et al; 5,100,499 to Douglas; 5, 167,748, to Hall et al; 5, 185,058 to Cathey; 5,200,032, to Shinohara; 5,215,619 to Cheng, et al; and 5,221,430 to Kadomura, et al., all of which are incorporated herein by this reference.

After etching the electrode layer, a second insulative film is adhered over the patterned copper layer so that the copper layer is embedded within the insulative layer. Suitable insulative films include, "KAPTON", a polyamide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan.

The grooves 36 through the insulator 26 are typically formed by stamping out a suitable groove pattern through the insulated electrode. The stamped out insulated electrode 24 is then adhered to the base 22 using conventional pressure or temperature based adhesives, to form the chuck shown in FIG. 2a.

With reference to FIG. 2d, an insulated electrical connector strap 28 is then affixed to a segment of the electrode 24 using electrically conductive adhesive. The electrical connector strap 28 is adhered to the base 22 and to the support member 32 on the bottom of the base 22, using conventional temperature and pressure based adhesives. A high voltage electrical connector 30 is then electrically adhered to the electrical strap 28 to form a high voltage connector on the bottom of the base 22, for connecting the electrode 24 of the chuck 20 to the external voltage supply 46.

The version of the chuck shown in FIG. 2b, can be fabricated by the following procedure. An electrically insulative polymer film, such as for example, "KAPTON", "APIQUEO", "UPILEX", "NITOMID" films as previously described, is selected, and the electrode 24 and magnetic shunt 34 layers are formed on the insulative film.

The electrode 24 and shunt 34 layers can be formed by many different techniques, including for example, electroplating, chemical vapor deposition, and physical vapor deposition methods. A preferred method of forming the layers comprises a multi-step electroplating process which includes the steps of: (i) sputter depositing a "seed" chromium layer onto the insulative layer, (ii) coating the sputtered chromium layer with a resist layer, (iii) patterning the resist layer into a pattern corresponding to the desired electrode or shunt configuration, and (iv) electroplating metal onto the portions of the chromium seed layer which are not coated by resist to form the electrode or shunt.

When the electrode 24 and shunt 34 are made of different metals, the process is performed twice, once for electroplating the electrode 24, and the second time for electroplating the shunt 34. When the electrode and shunt comprise the same metal, the process is performed once.

In the first step of the multi-step electroplating process, a chromium layer is sputtered over the insulative film to obtain a "seed" layer for nucleating growth of the electroplated metal. The chromium layer is typically sputtered to a thickness of about 100–200 microns. Conventional chromium sputtering techniques are suitable, such as for example, those generally disclosed in U.S. Pat. No. 4, 131,530; U.S. Pat. No. 4,022,947; U.S. Pat. No. 4,392,992; and J. A. Thorton, "Sputter Deposition Onto Plastics," Proceedings 18th American Conference of Society of Vacuum Coaters, Key Biscayne, Fla., Apr. 7–9 (1975), pages 8–26.

In the next step, a resist layer, such as "RISTON" photoresist fabricated by DuPont de Nemours Chemical Co., Wilmington, Del., is applied over the chromium "seed" layer. Photolithographic methods, such as those previously described, are used to pattern the photoresist layer into a pattern corresponding to the desired configuration for the electrode 24 or shunt 34. The patterned resist layer prevents the deposition of electroplated metal on the resist-coated portions, during the electroplating step.

In the electroplating step, the resist-coated insulative film is electroplated to form a patterned electrode 24 between the resist-coated portions. Conventional copper plating techniques are suitable for forming the electrode 24, such as for example those disclosed in U.S. Pat. No. 5,252, 196, to Sonnenberg, et al.; U.S. Pat. No. 5,004,525, to Bernards, et al.; U.S. Pat. No. 4,898,647, to Luce, et al.; and U.S. Pat. No. 4,948,474, to Miljkovic. Conventional nickel plating techniques are suitable for forming the shunt 34, such as for example those disclosed above.

After forming the electrode 24 and shunt 34 on the chuck 20, remnant resist and chromium are etched from the chuck 20. Remnant resist is removed by wet chemical etching or plasma etching methods. A suitable wet chemical etching method comprises immersing the chuck 20 into a solution of N-methylpyrolidone heated to 80° C. for about ten minutes.

Alternatively, a plasma etching techniques, such as those utilizing an oxygen plasma, as generally disclosed in U.S. Pat. No. 3,837,856, to Irving, et al.; U.S. Pat. No. 4,786,578, to Neisius, et al.; and U.S. Pat. No. 4,938,839, to Fujimura, et al.—all of which are incorporated herein by reference—can also be used to etch the remnant resist. After removal of the resist remnant, residual chromium is removed by a wet chemical etching step, such as immersing the chuck 20 in a solution of sodium persulfate, followed by immersion in a solution of potassium permanganate.

A second electrically insulative film is then applied over the electrode 24 and shunt 34 in the form of a sheet of insulative material (as described above), or by spraying, dipping, painting, spin coating, or silk screening an electrically insulative liquid onto the exposed electrode and shunt. When a sheet of insulative material is applied, the insulative sheet is sized sufficiently large to cover the entire electrode and shunt.

When a sheet of insulative material is adhered on the electrode 24 and shunt 34, the grooves 36 can be formed by etching a groove pattern into upper insulative layer. Alternatively, when liquid insulative material is applied over the electrode and shunt, the viscous liquid insulative material flows into the trenches between the electrode 24 and shunt 34 forming the grooves 36.

Instead of electroplating, the electrode 24 and shunt 34 can also be formed by the steps of: (i) depositing a continuous metal layer on the insulative layer by chemical or physical vapor deposition techniques; (ii) forming a patterned resist layer on the metal layer, using the conventional techniques disclosed above; and (iii) etching the portions of the metal layer that are exposed between the resist coated portions, by a wet chemical or plasma activated etching process. Suitable chemical etching processes are generally described in U.S. Pat. No. 3,615,951, to Franco, et al.; U.S. Pat. No. 5,100,499, to Douglas; U.S. Pat. No. 5,167,748, to Hall, et al.; U.S. Pat. No. 5,185,058, to Cathey; U.S. Pat. No. 5,200,032, to Shinohara; U.S. Pat. No. 5,215,619, to Cheng, et al.; and U.S. Pat. No. 5,221,430, to Kadomura, et al.—all of which are incorporated herein by reference.

The versions of the invention shown in FIGS. 2c and 2d are fabricated using substantially the same techniques as described above, with the exception that the magnetic shunt 34 is formed as a separate piece. Typically, the magnetic shunt is machined from a plate of ferromagnetic material, such as nickel, using conventional machining techniques.

The base 22 of the chuck shown in FIG. 2d is formed by machining an aluminum plate into the desired shape. The electrical connector support member 32 can be formed by aluminum welding the support member onto the base 22, and thereafter, grinding the bottom surface of the base 22 to obtain a smooth contact surface.

Method of Using Chuck

Referring now to FIG. 1, a process according to the present invention is effected on a substrate 42 comprising a semiconductor wafer, such as a silicon or a gallium arsenide wafer. To effect the process, the process chamber 40 is evacuated to a pressure ranging from about 1 to about 500 mTorr, and more typically from about 10 to about 100 mTorr. A substrate 42 is transferred to the chamber 40 from a load lock transfer chamber (not shown), and placed on an electrostatic chuck 20 on a support 44 in the chamber 40.

Etchant process gas is introduced in the process chamber 40 using one or more sources of pressurized gas. Conventional halogencontaining etchant gases, such as for example, $Cl_2$, $BCl_3$, $CCl_4$, $SiCl_4$, $CF_4$, $NF_3$, and mixtures thereof, can be used to etch the substrate, as generally described in S. Wolf and R. N. Tauber, *Silicon Processing for the VLSI Era*, Vol. I, Chap. 16: Dry Etching for VLSI, Lattice Press, Sunset Beach, Calif. (1986), which is incorporated herein by reference.

The voltage supply 48 is then activated to electrically bias the support 44 with respect to the grounded surface 50, thereby forming a plasma from the process gas in the chamber 40. An alternating current is applied through the coil 54 around the chamber 40 to generate a magnetic field in the chamber 40 for enhancing the uniformity of the etching plasma in the chamber 40. The plasma activated etchant species impinge upon and etch the substrate 42.

The magnetic shunt 34 in the electrostatic chuck 20 depletes those portions of the magnetic field above the magnetic shunt 34, thereby precluding excessive etching of the substrate 42 at these regions and providing more uniform etching of the substrate 42. The magnetic shunt 34 also allows more uniform heat transfer from the substrate 42 thereby further enhancing etching uniformity.

Although the present invention has been described in considerable detail with reference to certain preferred versions, many other versions should be apparent to those skilled in the art. For example, a portion of the base, can be made from a ferromagnetic material to serve as the magnetic shunt. Also, the chuck can be used in other processes such as a chemical vapor deposition, physical vapor deposition, or sputtering processes. Therefore, the spirit and scope of the appended claims should not be limited to the description of the preferred versions contained herein.

What is claimed is:

1. An electrostatic chuck for holding a substrate in a process chamber during processing of the substrate in a magnetic flux, the electrostatic chuck comprising:
  (a) a base;
  (b) an insulator on the base, the insulator having a top surface for supporting the substrate thereon;
  (c) at least one non-ferromagnetic electrode in the insulator, the electrode capable of electrostatically holding the substrate; and
  (d) a ferromagnetic shunt in the insulator, the shunt capable of reducing the magnetic flux above the shunt to allow uniform processing of the substrate.

2. The electrostatic chuck of claim 1, wherein the non-ferromagnetic electrode is positioned below a central portion of the substrate, and the ferromagnetic shunt is disposed circumferentially about the electrode.

3. The electrostatic chuck of claim 1, wherein the ferromagnetic shunt comprises a planar ring positioned below a periphery of the substrate to reduce the magnetic flux above the periphery of the substrate.

4. The electrostatic chuck of claim 3, wherein the planar ring extends continuously about the electrode.

5. The electrostatic chuck of claim 3, wherein the planar ring comprises a thickness ranging from about 100 to 1000 microns.

6. The electrostatic chuck of claim 3, wherein the planar ring comprises segments having differing thicknesses.

7. The electrostatic chuck of claim 1, wherein the ferromagnetic shunt is made from ferromagnetic material having a relative magnetic permeability of at least about 1000.

8. The electrostatic chuck of claim 1, wherein the ferromagnetic shunt is made from material selected from the group consisting of iron, nickel, cobalt, and alloys thereof.

9. The electrostatic chuck of claim 1, wherein the non-ferromagnetic electrode and the ferromagnetic shunt comprise a unitary member comprising (i) non-ferromagnetic material disposed below a central portion of the substrate to serve as the electrode, and (ii) ferromagnetic material concentrated preferentially below a periphery of the substrate to serve as the shunt.

10. A process chamber for processing substrates in a magnetic flux, the process chamber comprising:

(a) a magnetic flux generator for generating a magnetic flux in the process chamber; and (b) the electrostatic chuck of claim 1.

11. The process chamber of claim 10, wherein the magnetic field generator generates a magnetic flux having a component substantially parallel to the substrate surface, and wherein the ferromagnetic shunt in the electrostatic chuck is shaped and sized to deplete the magnetic flux component at a periphery of the substrate.

12. The process chamber of claim 10, wherein the magnetic field generator comprises a coil wrapped around the process chamber.

13. An electrostatic chuck for holding a substrate having a periphery, in a process chamber during processing of the substrate in a magnetic flux, the electrostatic chuck comprising:

(a) a base including a peripheral wall extending downwardly from the base to define a cavity therein;

(b) an insulator on the base, the insulator having (i) a top surface for supporting the substrate thereon, and (ii) at least one non-ferromagnetic electrode in the insulator, the electrode provided for electrostatically holding the substrate; and (c) a continuous ferromagnetic planar ring in the cavity of the base, the planar ring extending continuously below the periphery of the substrate, and disposed directly below, and contiguous to the base.

14. The electrostatic chuck of claim 13, wherein the planar ring comprises a thickness ranging from about 100 to 1000 microns.

15. The electrostatic chuck of claim 13, wherein the planar ring comprises segments having differing thicknesses.

16. The electrostatic chuck of claim 13, wherein the ferromagnetic planar ring is made from ferromagnetic material having a relative magnetic permeability of at least about 1000.

17. The electrostatic chuck of claim 13, wherein the ferromagnetic planar ring is made from material selected from the group consisting of iron, nickel, cobalt, and alloys thereof.

18. The electrostatic chuck of claim 13, wherein the base comprises an electrical connector support extending inwardly from the peripheral wall, the connector support provided for supporting an electrical connector connected to the electrode to supply a voltage to the electrode from a voltage supply terminal in the process chamber, wherein the electrical connector support and base define a gap therebetween, and wherein a portion of the continuous ferromagnetic planar ring extends into the gap between the connector support and the base.

19. The electrostatic chuck of claim 18, wherein the base and electrical connector support are made from non-ferromagnetic material.

20. A process chamber for processing substrates in a magnetic flux, the process chamber comprising:

(a) a magnetic flux generator for generating a magnetic flux in the process chamber; and (b) the electrostatic chuck of claim 13.

21. The process chamber of claim 20, wherein the magnetic field generator comprises a coil wrapped around the process chamber.

22. An electrostatic chuck for holding a substrate in a process chamber during processing of the substrate in a magnetic flux, the electrostatic chuck comprising:

(a) a base comprising a substrate support having (i) peripheral walls extending upwardly from the base, (ii) a top surface, and (iii) a cavity defined by the peripheral walls and top surface;

(b) an insulator on the top surface of the substrate support, the insulator having (i) a surface for supporting the substrate thereon, and (ii) at least one non-ferromagnetic electrode in the insulator, the electrode provided for electrostatically holding the substrate; and (c) a continuous ferromagnetic planar ring in the cavity of the substrate support, the planar ring extending continuously along the peripheral walls of the substrate support, and disposed directly below, and contiguous to the top surface of the substrate support.

23. The electrostatic chuck of claim 22, wherein the planar ring comprises a thickness ranging from about 100 to 1000 microns.

24. The electrostatic chuck of claim 22, wherein the planar ring comprises segments having differing thicknesses.

25. The electrostatic chuck of claim 22, wherein the ferromagnetic planar ring is made from ferromagnetic material having a relative magnetic permeability of at least about 1000.

26. The electrostatic chuck of claim 22, wherein the ferromagnetic planar ring is made from material selected from the group consisting of iron, nickel, cobalt, and alloys thereof.

27. A process chamber for processing substrates in a magnetic flux, the process chamber comprising:

(a) a magnetic flux generator for generating a magnetic flux in the process chamber; and (b) the electrostatic chuck of claim 22.

28. The process chamber of claim 27 wherein the magnetic field generator comprises a coil wrapped around the process chamber.

* * * * *